(12) United States Patent
Heschel et al.

(10) Patent No.: US 7,388,285 B2
(45) Date of Patent: Jun. 17, 2008

(54) HERMETICALLY SEALED PACKAGE FOR OPTICAL, ELECTRONIC, OPTO-ELECTRONIC AND OTHER DEVICES

(75) Inventors: Matthias Heschel, Rodovre (DK); Kristian Blidegn, Copenhagen (DK); Jorgen Hoeg, Richardson, TX (US)

(73) Assignee: Hymite A/S, Kgs. Lyngby (DK)

( * ) Notice: Subject to any disclaimer, the term of this patent is extended or adjusted under 35 U.S.C. 154(b) by 0 days.

(21) Appl. No.: 11/501,139

(22) Filed: Aug. 8, 2006

(65) Prior Publication Data

US 2006/0273449 A1 Dec. 7, 2006

Related U.S. Application Data

(62) Division of application No. 10/792,529, filed on Mar. 3, 2004, now Pat. No. 7,109,580.

(51) Int. Cl.
*H01L 23/12* (2006.01)
(52) U.S. Cl. .............. 257/704; 257/432; 257/433; 257/E23.098; 257/E23.087
(58) Field of Classification Search ............. 257/704, 257/E23.098
See application file for complete search history.

(56) References Cited

U.S. PATENT DOCUMENTS 4,558,171 A 12/1985 Gantley et al.

| | | | |
|---|---|---|---|
| 4,700,973 A | 10/1987 | Gademann et al. |
| 4,967,597 A | 11/1990 | Yamada et al. |
| 5,936,758 A | 8/1999 | Fisher et al. |
| 6,300,294 B1 | 10/2001 | Robbins et al. |
| 6,550,263 B2 | 4/2003 | Patel et al. |
| 2002/0056898 A1 | 5/2002 | Lopes et al. |
| 2004/0012838 A1 | 1/2004 | Huibers |
| 2004/0016995 A1 | 1/2004 | Kuo et al. |
| 2004/0026479 A1 | 2/2004 | Farnworth |
| 2004/0121517 A1 | 6/2004 | Silverbrook |
| 2005/0039687 A1 | 2/2005 | McLeod |

FOREIGN PATENT DOCUMENTS

EP 0 261 555 3/1988
EP 0 849 578 6/1998

*Primary Examiner*—Tu-Tu Ho
(74) *Attorney, Agent, or Firm*—Fish & Richardson P.C.

(57) ABSTRACT

Techniques are disclosed for hermetically sealing one or more devices within a package. According to one aspect, a lid is attached to a substrate on which one or more devices are provided such that the devices are encapsulated within an area defined by the substrate and the lid. A substance, such as a lubricant or gas, is introduced via one or more through-holes in the lid to a region that is separated from the devices by a wall having at least one opening through which the substance can pass to the devices. The through-hole then may be hermetically sealed, for example, using a local heating process that does not degrade the lubricant or other substance.

20 Claims, 8 Drawing Sheets

HERMETICALLY SEALED PACKAGE FOR OPTICAL, ELECTRONIC, OPTO-ELECTRONIC AND OTHER DEVICES

CROSS-REFERENCE TO RELATED APPLICATION(S)

This application is a divisional of U.S. Ser. No. 10/792,529, filed Mar. 3, 2004, now U.S. Pat. No. 7,109,580.

BACKGROUND

The present disclosure relates to the hermetically sealed packaging of optical, electronic, opto-electronic and other devices.

The packaging of integrated circuit chips, which may include, for example, one or more optical, electronic or opto-electronic components, typically requires that the package be hermetically sealed to prevent contaminants such as moisture from interfering with proper operation of the components. High quality, hermetically sealed packages may be filled, for example, with a passivating, inert gas such as nitrogen. Other ambients, including substances such as lubricants and buffer gases, may be introduced into the package to reduce degradation of the components encapsulated within the package.

Many hermetic packaging technologies, such as reflow soldering, glass soldering, anodic bonding and welding, use temperatures above 300° C. Unfortunately, certain substances that may be useful for reducing wear of the components in the package degrade when exposed to such high temperatures.

Nevertheless, it would be helpful to provide a technique to facilitate the introduction of wear-reducing or other substances that may be incompatible with the high temperatures often used to fabricate hermetically sealed packages.

SUMMARY

Techniques are disclosed for hermetically sealing one or more devices within a package.

According to one aspect, a lid is attached to a substrate on which one or more devices are provided such that the devices are encapsulated within an area defined by the substrate and the lid. A substance, such as a lubricant or gas, is introduced via a through-hole in the lid to a region that is separated from the devices by a wall having an opening through which the fluid can pass to the devices. The through-hole then is hermetically sealed.

In various implementations, one or more of the following features may be present. For example, the lid may be attached to the substrate by soldering the lid to the substrate to form a hermetic seal. In some cases, that may involve the use of relatively high temperatures.

The substance may comprise, for example, a lubricant that, with the passage of time, slowly evaporates and passes through the opening(s) in the wall to the devices. The lubricant or other substance may help reduce wear or otherwise extend the lifetime of the devices. It also may improve operation of the devices. The through-hole(s) through which the substance is introduced may be sealed hermetically, for example, using a local heating process that does not degrade the lubricant or other substance.

The techniques may be used to fabricate multiple packages from a single substrate wafer and a single lid wafer, with each package hermetically encapsulating one or more devices. After the packages are hermetically sealed, they may be separated from one another, for example, by dicing.

In various implementations, one or more of the following advantages may be present. Hermetically sealed packages with a controlled ambient for the encapsulated devices are disclosed. Furthermore, by introducing the substance (e.g., lubricant) after performing any high-temperature processes that may be required for attaching the lid to the substrate, degradation of the substance that might otherwise result from the high temperatures may be avoided.

Other features and advantages will be readily apparent from the following detailed description, the accompanying drawings and the claims.

DETAILED DECRIPTION

The techniques described here may be used, for example, in connection with the packaging of various optical, electronic, opto-electronic and other devices for which it is desirable to provide a controlled atmosphere within the package. Each package may encapsulate one or more devices, which may be formed, for example, on a semiconductor substrate. Although the techniques may be used in connection with a wide range of components, the techniques may be particularly advantageous for use with the packaging of devices on a wafer level that require encapsulation prior to dicing. For example, the devices may include MEMS-based (i.e., MicroElectroMechanical System-based) transducers such as micro-mirrors, accelerometers and chemical sensors, among others. In other implementations, the devices may include MOEMS-based (i.e., MicroOptoElectroMechanical Systm-based) devices.

For purposes of illustration, the particular implementation discussed below incorporates a micro-mirror array. Such arrays may include as many as one million micro-mirrors to achieve video graphics array (VGA) resolution. The mirrors may be fabricated, for example, using MEMS technologies on silicon (Si) wafers. The wafers are diced after processing to separate the individual arrays. Preferably the individual arrays should be packaged prior to dicing to avoid damaging the micro-mirrors. A lubricant or other fluid, such as a liquid or gas, may be introduced into the package to reduce wear of the micro-mirrors.

Figure 1:
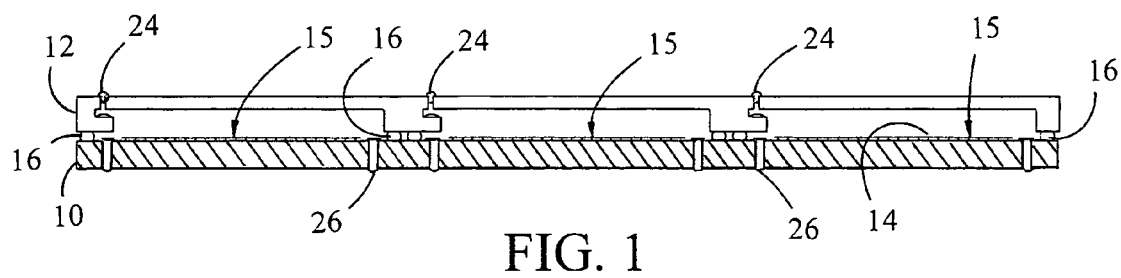
FIG. 1 illustrates a schematic cross-section of hermetically sealed packages according to an implementation of the invention.
Figure 2:
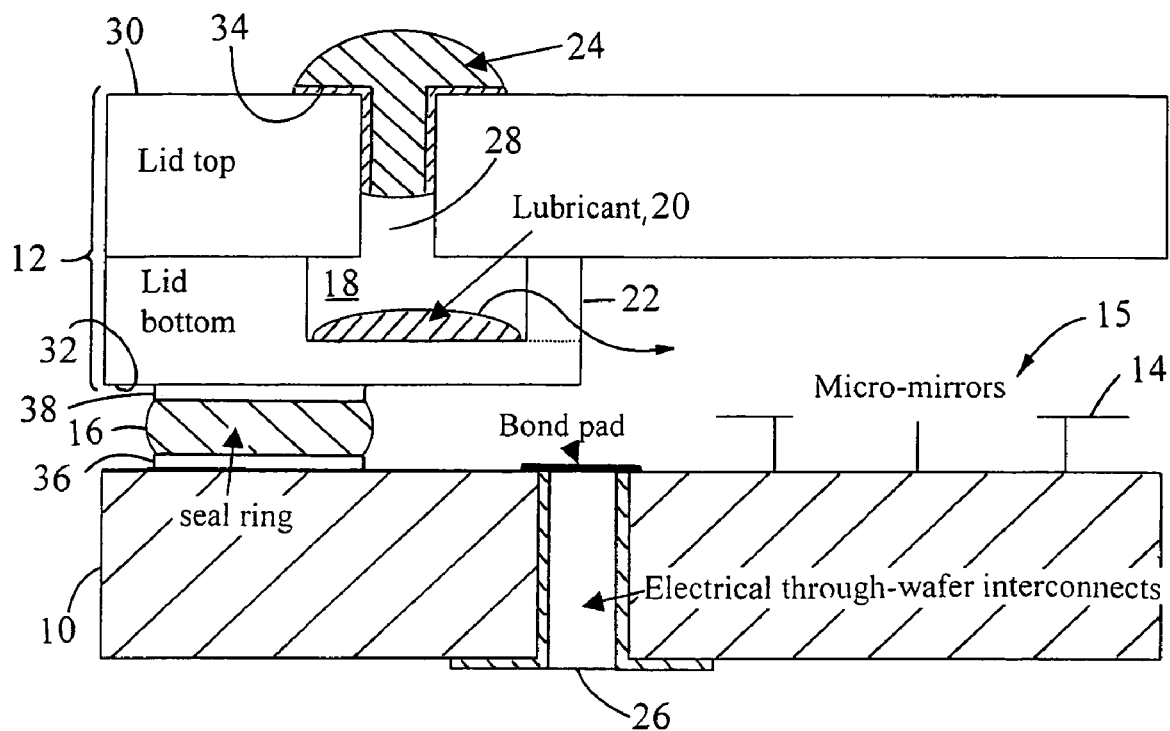
FIG. 2 illustrates an enlarged view of various features of FIG. 1.

FIG. 1 illustrates three packages prior to dicing. Each package hermetically encapsulates an array 15 of micro-mirrors 14. As shown in FIGS. 1 and 2, a wafer 10 serves as a substrate for the micro-mirrors 14. A lid 12 is attached to the wafer 10, for example, by bonding. In general, the lid 12 may be transparent to optical signals that the devices transmit or receive during their operation. For example, in the illustrated implementation, the lid 12 is transparent to optical signals to be reflected by the micro-mirrors 14. Each array 15 of micro-mirrors 14 may be surrounded, for example, by a solder seal ring 16.

Figure 3A:
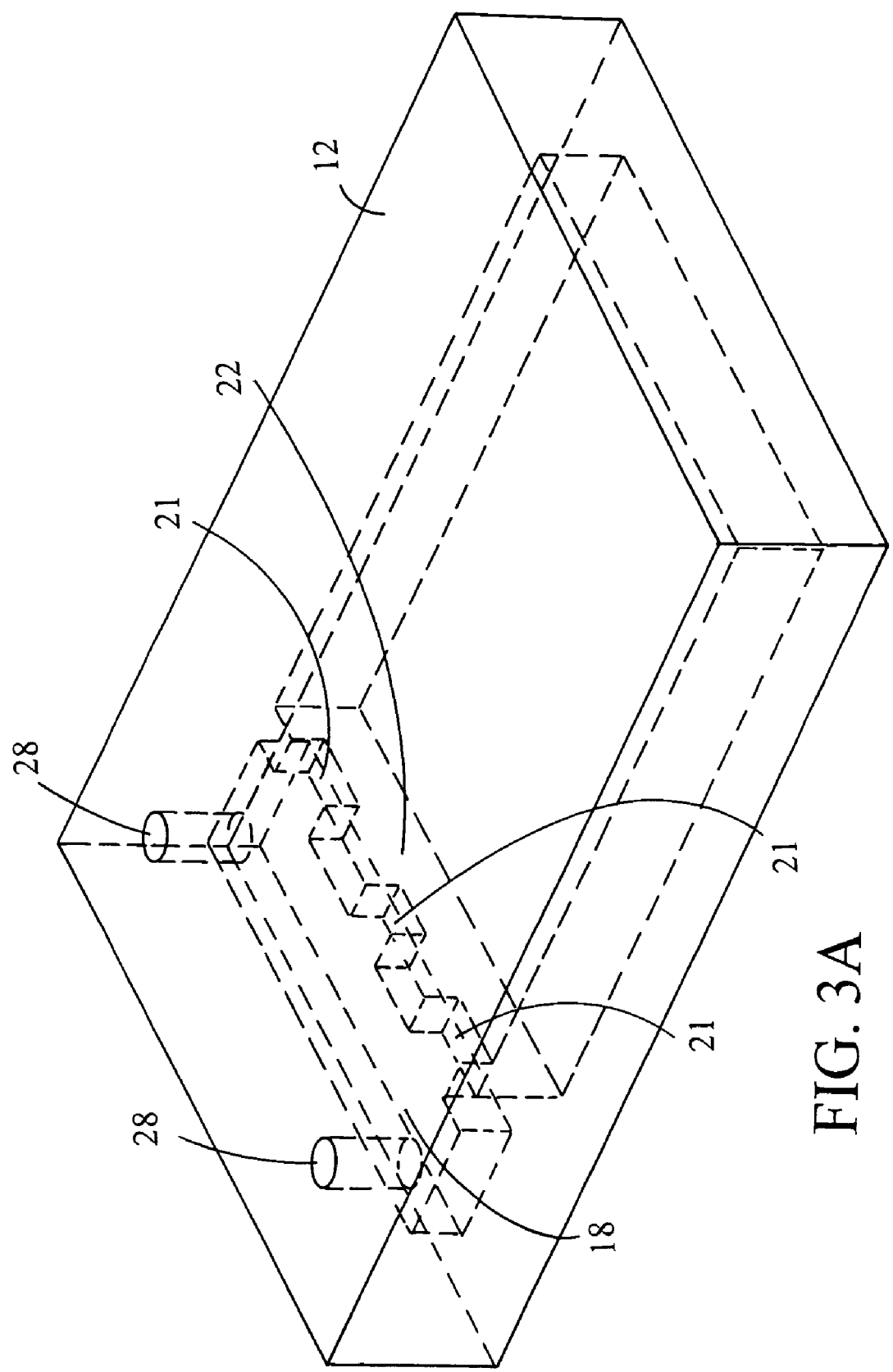
FIG. 3A illustrates an elevated view of the package lid.
Figure 3B:
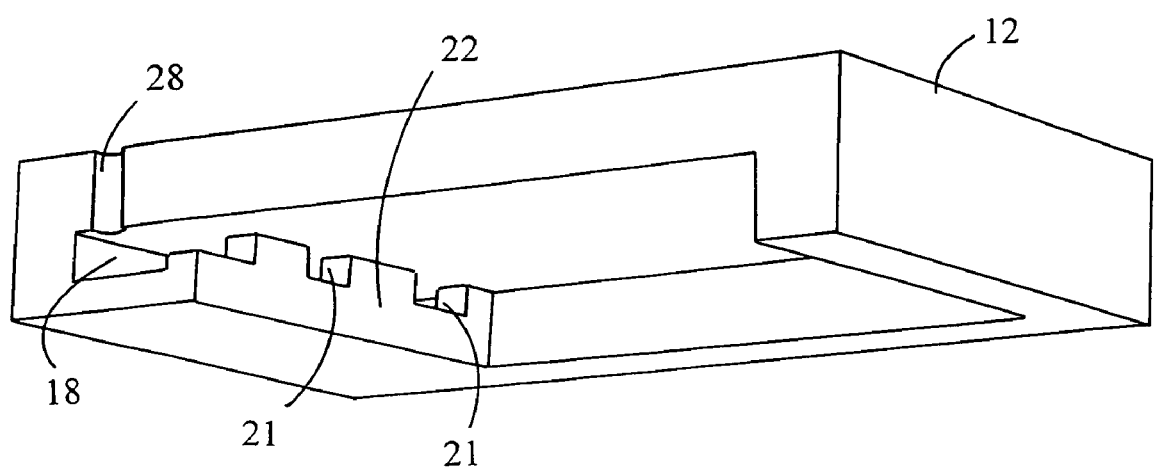
FIG. 3B illustrate a cut-away view of the lid.
Figure 3C:
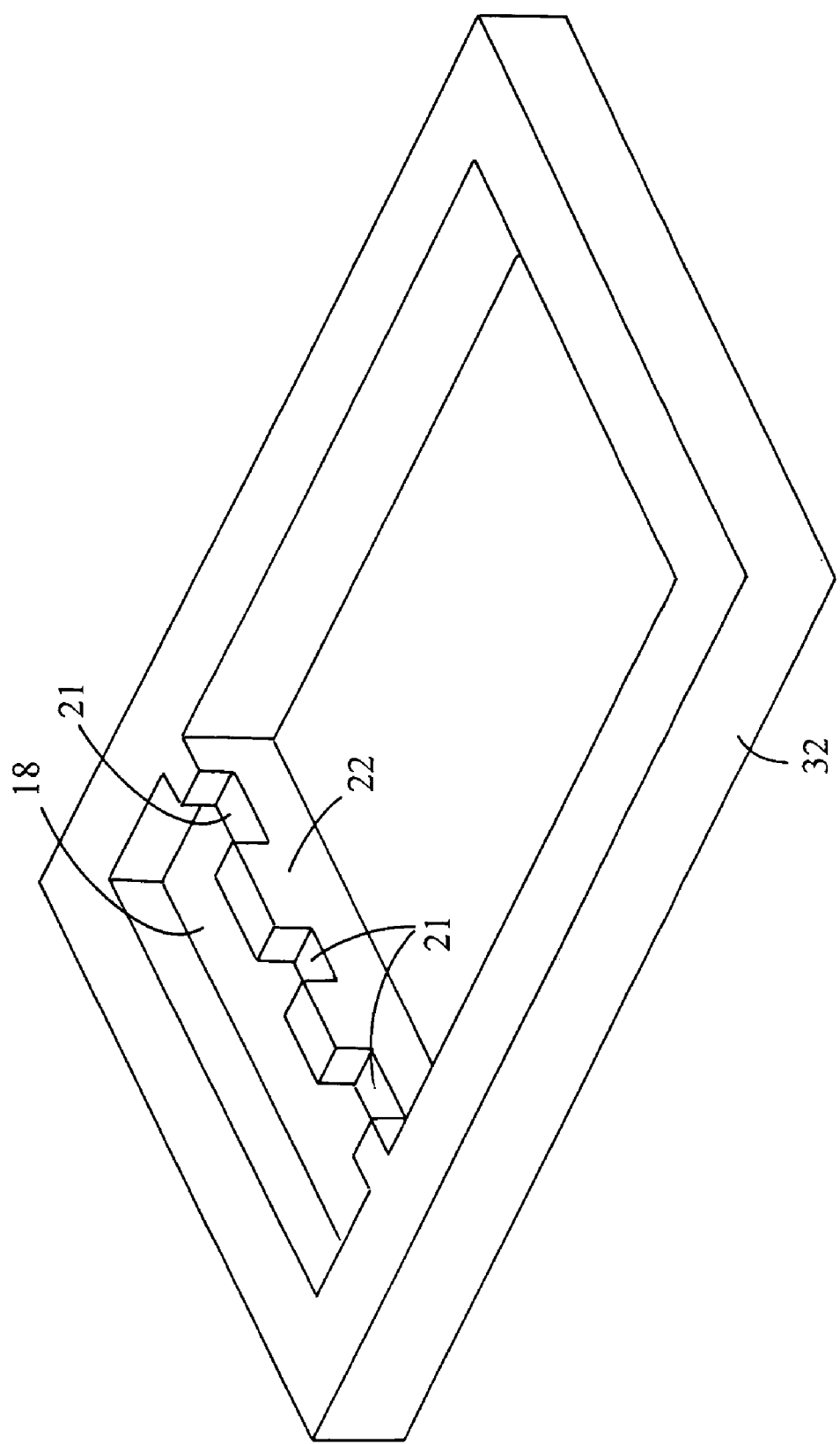
FIG. 3C illustrates the lower portion of the lid.

Each section of the lid 12 that encapsulates one of the micro-mirror arrays includes a region 18 to hold a reservoir of lubricant 20 or other substance to provide a desired ambient to the micro-mirrors 14 formed on the semiconductor substrate. As shown in FIGS. 3A through 3C, one or more openings 21 in side walls 22 of the lid 12 allow the lubricant or other substance to pass from the region 18 to the micro-mirrors 14. Preferably, the openings 21 in the side wall 22 are located somewhat above the bottom of the region 18 so that, as the lubricant evaporates, it slowly passes to the area of the micro-mirrors. Through-holes 28 in the top of the wafer 12 through which the lubricant is introduced into the region 18 may be hermetically sealed with solder seal 24. Electrical contact 26 to the micro-mirrors 14 may be made via through-holes in the micro-mirror wafer 10.

The foregoing structure may be fabricated as follows. The micro-mirror wafer 10 may be fabricated using known techniques. A solderable metallization 36 then may be deposited where the sealing ring 16 is to be formed. Through-holes for the electrical contacts 26 may be formed, for example, by dry etching, followed by passivation and metallization.

The transparent lid 12 may be composed, for example, of glass and, in the illustrated implementation, includes upper and lower parts 30, 32 that are bonded together. The top part 30 may include a plain glass wafer with anti-reflective coatings on either one or both of the two opposite major surfaces. The through-holes 28 are formed in the upper part 30, and metallization 34 is provided at the upper portion of the through-holes.

The bottom part 32 of the lid 12 may be formed, for example, as a molded glass wafer and includes regions 18 for the lubricant 20 and the openings in the side walls 22. Solderable metallization 38 is provided on the underside of the lower part 32 where the sealing ring 16 is to be formed.

Figure 4:
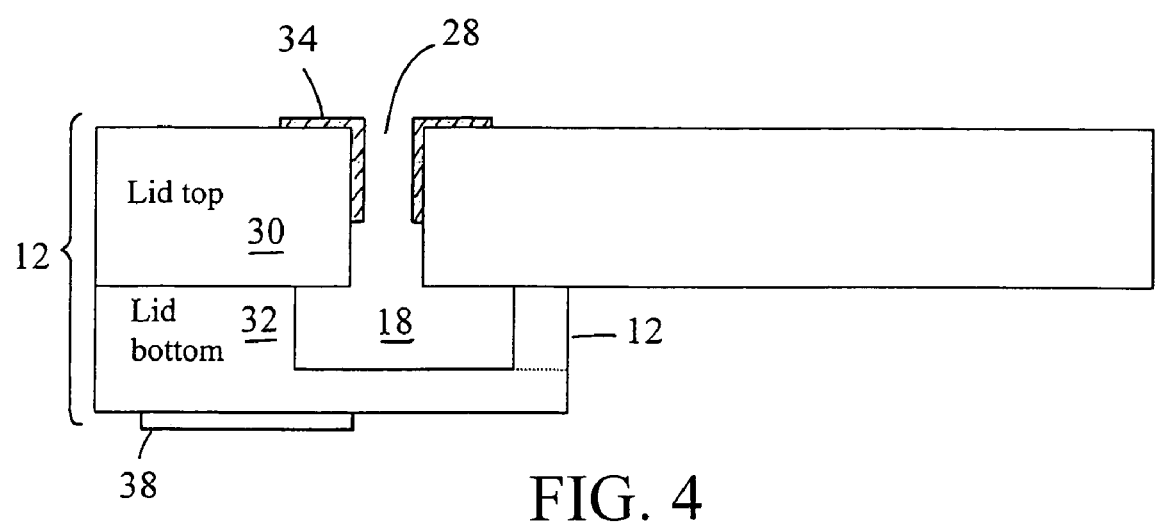
FIGS. 4, 5 and 6 illustrate various stages in the fabrication of the hermetically sealed package of FIG. 1 according to one implementation.

The upper and lower parts 30, 32 of the lid wafer 12 are bonded together so that each region 18 in the lower part 32 is located opposite a corresponding set of through-holes 28 in the upper part, as shown in FIG. 4. Solder preforms are deposited on the metallization 38 where the sealing rings 16 are to be formed.

Figure 5:
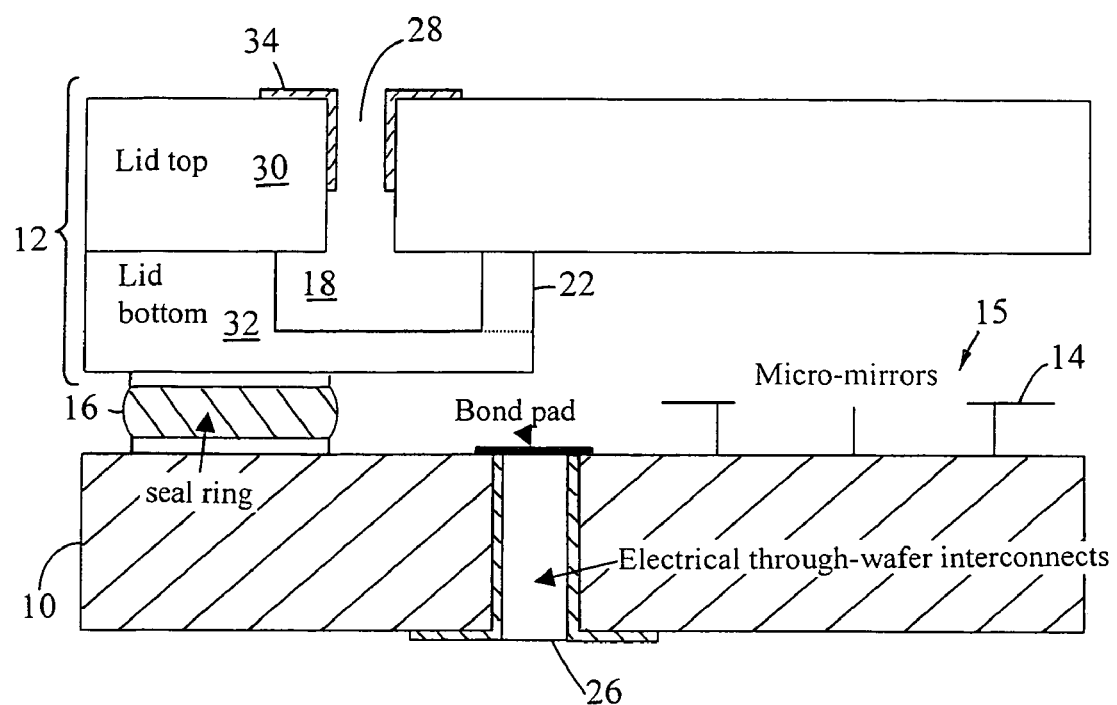

Next, the micro-mirror wafer 10 initially is encapsulated non-hermetically by bonding the lid 12 to the micro-mirror wafer using, for example, a fluxless reflow soldering process. The resulting structure is as shown in FIG. 5. In one particular implementation, the solder includes a compound comprising tin-silver (SnAg) with a soldering temperature of about 240° C. Other soldering materials may have even higher soldering temperatures. For example, a compound comprising gold-tin (AuSn) may have a soldering temperature of about 320° C. Formic acid may be used during the reflow process to reduce formation of solder oxide.

Figure 6:
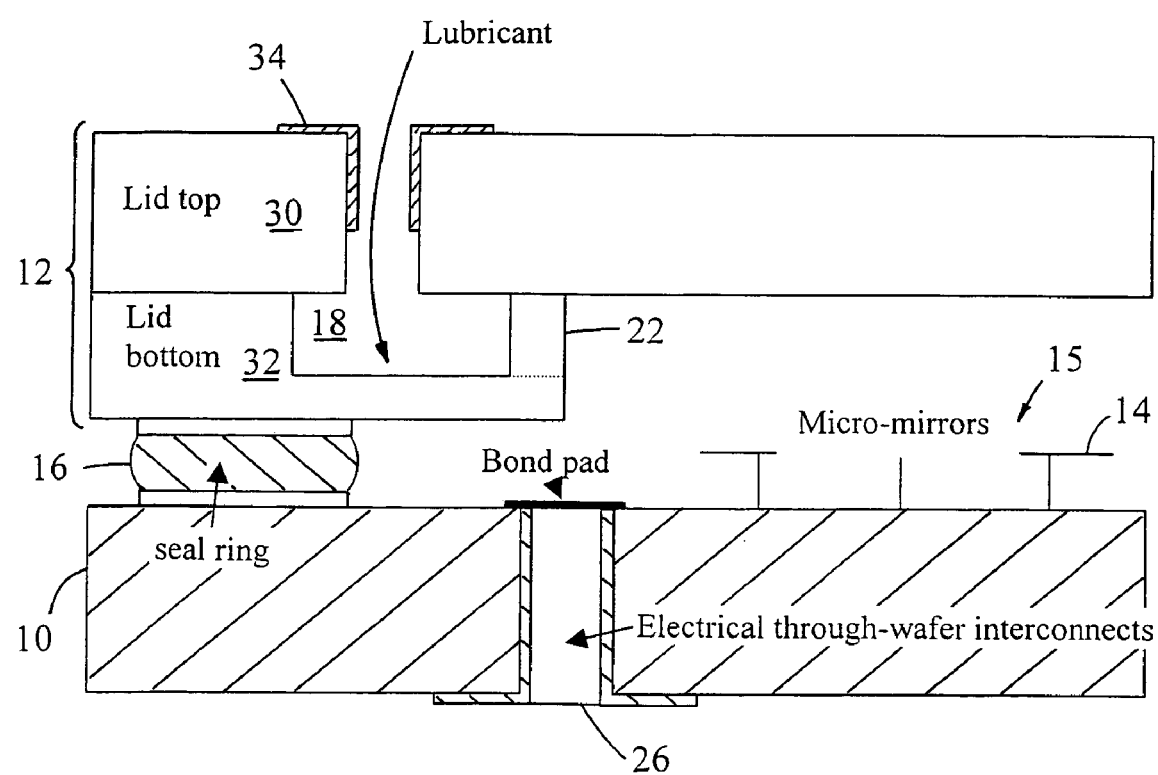

The lubricant 20 or other fluid is introduced to the regions 18 via the through-holes 28, as illustrated in FIG. 6. The lubricant may be introduced into the regions 18 using any one of various techniques. In one implementation, a supply of lubricant is connected to one group of through-holes 28, and atmosphere slowly is sucked from the enclosed volume of a second group of through-holes 28. First and second groups of through-holes 28 form respective pairs. The lubricant 20 may have a maximum allowable temperature that is well below the soldering temperatures used to bond the micro-mirror wafer 10 to the lid 12. For example, in one implementation, the lubricant may have a maximum allowable temperature of about 200° C. At temperatures higher than that, the lubricant may degrade.

Soldering materials having soldering temperatures different from those mentioned above may be used. Similarly, lubricants or other substances with maximum allowable temperatures different from the maximum temperature mentioned above may be introduced into the regions 18. Although the techniques are particularly advantageous for situations in which the maximum allowable temperature of the lubricant is well below the soldering temperatures, the techniques may be used in other situations as well.

Once the lubricant or other substance has been provided to the regions 18, the through-holes 28 are sealed hermetically (see FIG. 2), for example, by jet-soldering to ensure precise local heating that will not damage or degrade the lubricant or other fluid.

The individual arrays of micro-mirrors then may be diced to provide separate hermetically sealed packages of micro-mirror arrays. As the lubricant 20 held in the region 18 of each package evaporates, it can pass through the openings 21 in the side wall 22 between the region 18 and the area 40 where the micro-mirrors 14 are located. Thus, a hermetically sealed package may be provided with a lubricant or other substance that helps reduce wear or otherwise improves the operation of the components in the package. Furthermore, such packages can be provided even when the maximum allowable temperature of the lubricant or other substance is less than the temperature(s) used to seal the package.

Other implementations are within the scope of the claims.

What is claimed is:

1. A hermetically sealed package comprising:
   one or more devices on a semiconductor substrate;
   a lid attached to the semiconductor substrate to encapsulate the one or more devices such that the one or more devices are hermetically sealed within an area defined by the substrate and the lid;
   wherein the lid includes:
      a region containing a substance;
      a wall separating the region containing the substance from the one or more devices, wherein the wall has an opening through which the substance can pass to the one or more devices.

2. The package of claim 1 wherein the lid includes a material that provides a seal for a hole in the lid through which the substance was introduced into the package.

3. The package of claim 1 wherein the lid includes a material that hermetically seals a hole in the lid through which the substance was introduced into the package.

4. The package of claim 1 wherein the substrate includes an electrical contact from the exterior of the package to the one or more devices encapsulated within the package.

5. The package of claim 1 wherein the substance comprises a lubricant.

6. The package of claim 1 wherein the substance comprises a lubricant to reduce wear of the one or more devices.

7. The package of claim 1 wherein the substance comprises a fluid.

8. The package of claim 1 wherein the one or more devices include semiconductor devices.

9. The package of claim 1 wherein the one or more devices comprise an array of devices.

10. The package of claim 1 wherein the one or more devices comprise at least one MEMS device.

11. The package of claim 1 wherein the lid is transparent to optical signals with which the one or more devices interact during their operation.

12. The package of claim 1 wherein the substrate is attached to the lid by a solder seal ring.

13. The package of claim 1 wherein the substance comprises a lubricant that can pass by evaporation through the opening in the wall to the one or more devices.

14. The package of claim 13 wherein the wall has a plurality of openings through which the lubricant can pass to the one or more devices.

15. The package of claim 13 wherein the region containing the substance is defined by walls attached to the lid.

16. The package of claim 15 wherein the opening is located higher than the bottom of the region containing the substance.

17. A hermetically sealed package comprising:
one or more devices on a substrate;
a lid attached to the substrate to encapsulate the one or more devices such that the one or more devices are hermetically sealed within an area defined by the substrate and the lid;
wherein the lid is transparent to optical signals with which the one or more devices are arranged to interact during their operation and wherein the lid includes:
a region containing a substance;
a wall separating the region containing the substance from the one or more devices, wherein the wall has an opening through which the substance can pass to the one or more devices.

18. The package of claim 17 wherein the lid comprises glass.

19. The package of claim 17 wherein the one or more devices comprise one or more semiconductor devices.

20. The package of claim 19 wherein the substance comprises a lubricant that can pass by evaporation to the one or more devices.

* * * * *